United States Patent [19]
Chapman et al.

[11] Patent Number: 5,986,795
[45] Date of Patent: Nov. 16, 1999

[54] DEFORMABLE MIRROR FOR SHORT WAVELENGTH APPLICATIONS

[76] Inventors: Henry N. Chapman, 2417 Kilkare Rd., Sunol, Calif. 94586; Donald W. Sweeney, 5020 Canyon Crest Dr., San Ramon, Calif. 94583

[21] Appl. No.: 09/098,024

[22] Filed: Jun. 15, 1998

[51] Int. Cl.⁶ .................................................. G02B 26/08
[52] U.S. Cl. ......................... 359/224; 359/846; 359/849
[58] Field of Search ................................. 359/223, 224, 359/355, 846–849

[56] References Cited

U.S. PATENT DOCUMENTS 4,655,563  4/1987  Plante et al. ............................ 359/849

Primary Examiner—James Phan
Attorney, Agent, or Firm—Daryl S. Grzybicki

[57] ABSTRACT

A deformable mirror compatible with short wavelength (extreme ultraviolet) radiation that can be precisely controlled to nanometer and subnanometer accuracy is described. Actuators are coupled between a reaction plate and a face plate which has a reflective coating. A control system adjusts the voltage supplied to the actuators; by coordinating the voltages supplied to the actuators, the reflective surface of the mirror can be deformed to correct for dimensional errors in the mirror or to produce a desired contour.

13 Claims, 1 Drawing Sheet

DEFORMABLE MIRROR FOR SHORT WAVELENGTH APPLICATIONS

The United States Government has rights in this invention pursuant to Contract No. W-7405-ENG48 between the U.S. Department of Energy and the University of California, for the operation of Lawrence Livermore National Laboratory.

BACKGROUND OF THE INVENTION

1. Field of the Invention

This invention is related to deformable optics for use with short wavelength radiation.

2. Background of the Invention

The use of mirrors or reflective optics for applications with short wavelength radiation (e.g., <200 nm) is well-known. Reflective optics are required for short wavelength radiation because refractive optics absorb, but do not transmit at these wavelengths. Although reflective optics absorb some shortwave radiation, much of the incident radiation can be reflected with special reflective coatings.

One example of a commercial application for short wavelength radiation compatible mirrors is extreme ultraviolet (EUV) photolithography, which is used in the manufacture of semiconductor devices. The use of short wavelength or EUV radiation (<20 nm) in semiconductor photolithography is being developed to reduce the resolution dimension, which is proportional to wavelength. A smaller resolution dimension allows more devices to be fabricated onto a given area of a wafer.

To accurately project an image onto a wafer through an optical system in photolithography, the image distortion must be very low. For commercial semiconductor production, the image distortion of an optical system should not be greater than 10% of the resolution dimension. Because the resolution dimension of EUV optical systems may be in the 50 to 100 nm range, the distortion must be proportionally small, approximately 5 to 10 nm. If the distortion exceeds 10% of the resolution dimension, excessive lithography errors can occur, resulting in defective integrated circuits.

In order to produce optical systems with less than 10 nm distortion, the mirrors used in EUV optical systems must have extremely high dimensional accuracy. Dimensionally correct mirrors have better imaging performance, higher EUV throughput, and longer lifetime between refurbishments. However, such low dimensional tolerances for optical systems make fabrication of acceptable mirrors, particularly aspheric mirrors, extremely difficult. Dimensional defects in mirror surfaces can result from inaccurate machining of the optics, and subsequent uneven deposition of reflective coatings, which are used to maximize the reflectivity of EUV optical elements. However, even with dimensionally perfect mirrors, dimensional defects can occur during short wavelength radiation exposure due to thermal loading, reflective coating stress, gravitational loading, and improper maintenance. Out of tolerance mirrors will produce unacceptably high image distortion at the wafer.

Deformable mirrors allow the reflective surface to be adjusted within the required dimensional tolerances during use without having to disassemble the optical system. U.S. Pat. No. 4,655,563 is an example of a deformable mirror which uses a number of actuators mounted on the back of the mirror to manipulate the mirror surface. Although the mirror of the '563 patent is deformable, it is not compatible with EUV radiation and therefore cannot deform the surface deflection within the nanometer tolerances required for short wavelength radiation photolithography optical systems.

Another deformable mirror is disclosed in U.S. Pat. No. 5,420,436. The '436 patent describes a deformable mirror that is compatible with EUV radiation and has a thin flexible reflective surface which is deformed by piezo actuators. Although the mirror described in the '436 patent is deformable, it also is not controllable within the tolerances required for EUV lithography, namely, nanometer to subnanometer accuracy. The actuators are connected between a stiff base and a flexible reflective surface, and any movement of the actuators directly deforms the reflective surface.

In view of the foregoing, there is a need for a deformable mirror which can precisely deform a mirror within the nanometer-subnanometer tolerances required for EUV lithography, and the reflective surface must be compatible with EUV radiation.

SUMMARY OF THE INVENTION

The present invention is a deformable mirror that can be precisely controlled to nanometer and subnanometer accuracy and is compatible with short wavelength radiation. The deformable mirror of the present invention uses numerous actuators, a reflective face plate, and a reaction plate. The actuators are situated between the face plate and the reaction plate and connected to both. Both plates have some degree of flexibility and are configured to have specific bending characteristics.

The reaction plate of the inventive deformable mirror is typically more flexible than the face plate. When an actuator force is applied, the reaction plate deflection is significantly greater than the deflection of the face plate. Thus the majority of an actuator's movement is applied to deformation of the reaction plate and only a small percentage of the actuator's movement deforms the face plate. A control system utilizes the bending characteristics of both the face and reaction plates to precisely regulate the deformation of the face plate to within a dimensional tolerance of at least 0.2 nm.

The inventive deformable mirror is configured such that a given input voltage to any actuator will deform an area of the face plate. Because the stiffness of the face plate varies with thickness, the force required to deform the face plate at any given point varies. Thus, each actuator may receive a different input voltage.

The present invention can be used for concave, convex, or flat mirrors. In particular, the invention may be used to form aspheric reflective surfaces from spherical surfaces. Aspheric surfaces can be produced from spheric elements by deforming the spheric surface to the required aspheric dimensions. Because the aspheric departure from a spheric surface can be very small, the inventive deformable mirror is a simpler means of producing aspheric reflective surfaces than machining a complex aspheric mirror surface.

BRIEF DESCRIPTION OF THE DRAWNGS

DETAILED DESCRIPTION OF THE INVENTION

Figure 1:
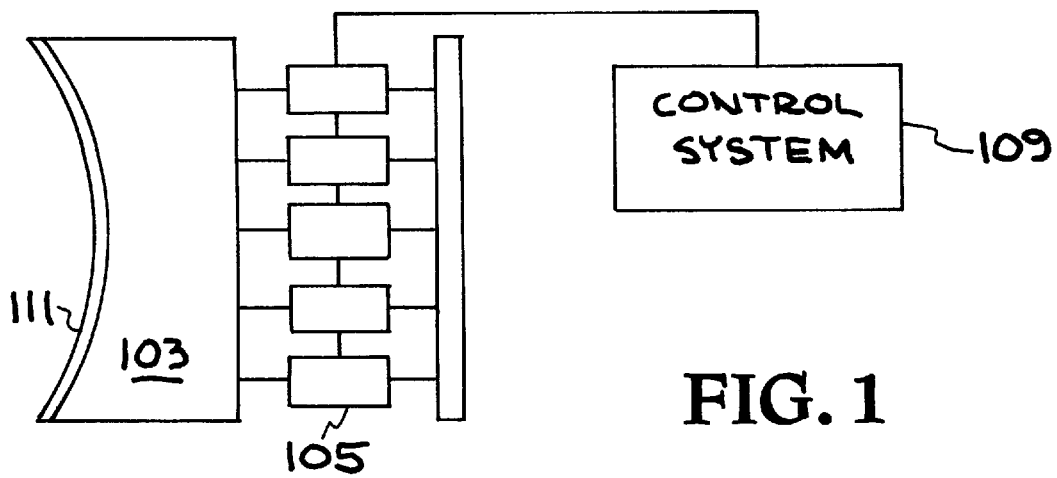
FIG. 1 is a side plan view of a concave deformable mirror in accordance with the present invention.

The following is a detailed description of the presently preferred embodiments of the present invention. However, the present invention is in no way intended to be limited to the embodiments discussed below or shown in the drawings. Rather, the description and the drawings are merely illustrative of the presently preferred embodiments of the invention.

The present invention is a deformable mirror designed for use with short wavelength radiation (<200 nm), and particularly for use with EUV radiation (<20 nm). FIG. 1 depicts the exemplary inventive apparatus. The apparatus comprises a face plate 103 (mirror), a number of actuators 105, a reaction plate 107, and a control system 109 that is connected to each of the actuators 105. The actuators 105 are connected between the back of the face plate 103 (i.e., the side without a reflective coating) and the reaction plate 107. The side of the face plate 103 opposite of the actuators 105 has a reflective surface 111 compatible with short wavelength radiation.

When a voltage is applied to each actuator 105, the actuators 105 respond by producing an expansion force proportional to the input voltage. By coordinating the forces applied by the actuators 105 through a control system 109, the face plate 103 and reflective surface 111 can be deformed to the desired contour. The controlled deformation is used to remove small defects in the contour of reflective surface 111 or to form a desired surface geometry (such as an asphere from a spherical surface). Within a short wavelength photolithography optical system, dimensionally correct optical elements produce the desirable characteristics of less image distortion and higher radiation throughput.

The face plate 103 can be any shape, but generally is concave, convex, or a flat surface. The construction of such optical elements is well-known. The inventive reaction plate 107 is typically made thinner (or of less stiff material) and thus is more flexible than the face plate 103; the area of the reaction plate 107 in contact with a specific actuator 105 will deflect more than the area of the face plate 103 also in contact with the actuator 105. The stiffness and configuration of the actuators 105 will also affect the deflection characteristics of the face plate 103. By knowing the dimensions and physical characteristics of face plate 103 and reaction plate 107, as well as the configuration and characteristics of actuators 105, a relationship between the force applied by the actuators 105 and the deformation of face plate 103 can be solved. Because the stiffness and bending characteristics can vary across the face plate 103, the deformation relationship must be solved for all contact points of actuators 105, either mathematically or experimentally.

Based on the knowledge of the face plate bending characteristics, a control system 109 can be configured to coordinate the voltages supplied to each of the actuators 105 and thereby accurately distort the face plate 103 to the required contour. To simplify the deformable mirror control system 109, all actuators 105 can be configured to produce the same deflection in face plate 103 for a given actuator 105 input voltage. Where the face plate 103 and reaction plate 107 have uniform thicknesses (flat, planar) and actuators 105 are evenly spaced from one another, the deflection for an actuator force is uniform across the face plate 103.

However, when the face plate 103 has a complex shape of variable thickness, the deflection for a given force varies depending upon the face plate 103 stiffness at the interface with the actuator 105. The non-planar face plate 103 of the present invention is typically either convex or concave in shape, and may be spherical or aspherical. A concave surface face plate 103, such as shown in FIG. 1, will have a stiffer perimeter and more flexible center. Conversely, a convex shaped face plate will have a stiffer and more flexible perimeter.

In areas where the face plate 103 is stiffer than the reaction plate 107, the face plate 103 will only deform slightly for a given actuator 105 movement, while the deflection of the reaction plate 107 will be much greater. To increase the face plate 103 deflection for a specific area, the stiffness of the corresponding area of the reaction plate 107 is increased. By adjusting the relative stiffness of both the face plate 103 and reaction plate 107 at the actuator 105 contact points, a deformable mirror can be formed that produces a uniform deflection for a given actuator 105 input voltage.

Figure 2:
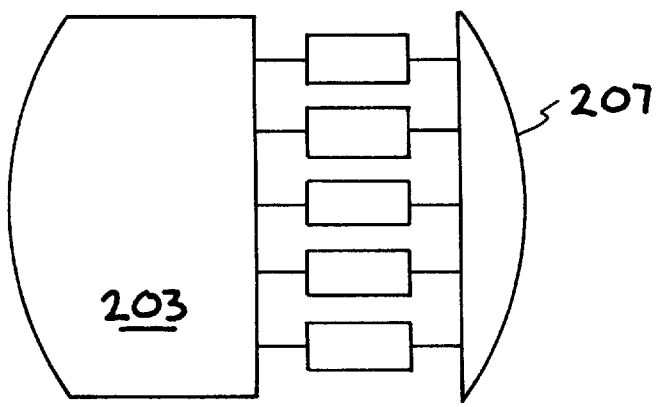
FIG. 2 is a side plan view of a deformable convex mirror with a convex reaction plate in accordance with the present invention.
Figure 3:
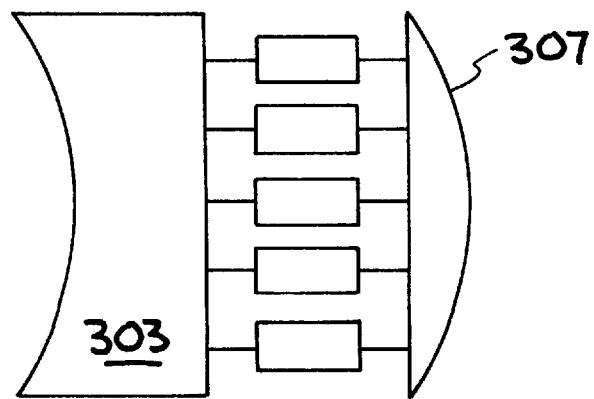
FIG. 3 is a side plan view of a deformable convex mirror with a concave reaction plate in accordance with the present invention.

Referring to FIG. 2, a convex face plate 203 may be used with a convex reaction plate 207 to obtain a uniform deformation for a given actuator input. However, in certain applications as shown in FIG. 3, a concave face plate 303 may be used with a convex reaction plate 307 to achieve the desired deformation. Similarly, a convex face plate may be used with a concave reaction plate for a given application.

The actuators are made of special materials, such as piezoelectrical, electroresistive, or magnetoresistive, that produce an expansion force proportional to the voltage input. The actuators can be modeled as an electromechanical device and an internal spring. As an example, the internal spring may have a nominal stiffness or spring rate of approximately 128 N/mm, so that in order to deform an actuator by 1 mm, a compressive or tensile force of 128 Newtons is required. If the electromechanical component of the actuator has a force/volt ratio of approximately 5.3 N/V, then for every volt applied to the actuator, a force of 5.3 Newtons is generated. When a voltage is applied, the actuator produces a combination of displacement and force. If a voltage is applied to the actuator and no force counteracts the actuator, it will expand until the electromechanical force is equal to the spring force. If the actuator is not allowed to expand, the internal spring force will not oppose the electromechanical force, and the full electromechanical force will be exerted. Table 1 illustrates the force/displacement actuator relationship for 10 volts applied to an actuator:

TABLE 1

| Displacement (mm) | Force (Newtons) |
|---|---|
| 0.000 | 53.00 |
| .1035 | 39.75 |
| .2070 | 26.50 |
| .3105 | 13.25 |
| .4140 | 0 |

The force and displacement relationship of the actuator is linear. When a voltage is applied, an actuator will expand until the compressive force equals the actuator expansion force, resulting in static equilibrium. The actuator displacement will vary for a given input voltage based on the corresponding compressive forces exerted by the face plate and the reaction plate. As the actuator expands, the face plate and reaction plate will oppose the motion with a compressive force. Static equilibrium of an actuator in contact with flexible face plate and reaction plate areas will be a high displacement position with a low expansion force. Conversely, the static equilibrium of an actuator in contact with stiff areas of the face plate and reaction plate will be a low displacement position with high expansion force. The actuator displacement and force characteristics must be considered when configuring the face plate and reaction plate to provide a uniform deformation for a given actuator input voltage.

The inventive deformable mirror is capable of precise subnanometer dimensional control of the face plate. The reaction plate of the inventive deformable mirror is much more flexible than the face plate, thus the reaction plate will be deformed to a much higher degree (e.g., orders of magnitude) than the face plate by any movement of an actuator. Another factor affecting the deformable mirror accuracy is the actuator input voltage stability. In order to hold the face plate to a desired position, accurate direct current input voltages to the actuators are required.

Referring again to FIG. 1, in the preferred embodiment a majority of actuators 105 are partially expanded with each of the actuators having an equal nominal input voltage. For example, if 100 volts are applied to each actuator 105 and there are no forces opposing actuator 105 expansion, the face plate 103 will move 4.14 mm (100V×5.3 $NV^{-1}$/128 $Nmm^{-1}$). Because most of the actuators 105 are partially expanded, individual actuators 105 can be further expanded to create protrusions or contracted to create recesses in the face plate 103. To further expand an actuator 105, a higher than nominal voltage is applied. Conversely, to contract an actuator 105, a lower than nominal voltage is applied. Thus, the control system 109 can deform the face plate 103 to the desired shape by coordinating the actuator 105 voltages.

In another embodiment, the control system 109 is able to compensate for the non-uniform deflections of the face plate 103 for a given actuator 105 input voltage. The control system 109 transmits the necessary voltages to the actuators 105 in order to produce the required face plate 103 contour. In this embodiment, the control system applies a specific voltage/displacement constant to each of the actuators 105 and is able to compensate for non-uniform deflection of the face plate 103. Actuators 105 located at relatively stiff areas of the face plate 103 have higher voltage/displacement constants, while actuators 105 located at more flexible areas of the face plate 103 have lower voltage/displacement constants. The control system 109 of this embodiment can include dedicated electronic circuitry or a software control program.

The deformable mirror can be used to correct defects in a mirror surface. These defects can result from a variety of sources, including inaccurate fabrication and thermal distortion. Short wave radiation incident upon inventive deformable mirror is partially reflected and partially absorbed. The absorbed short wavelength radiation heats the mirror causing thermal expansion and thermal distortion. The inventive deformable mirror can compensate for thermal expansion induced by short wavelength radiation absorption.

To maximize the reflected portion of the incident short wave radiation, a special reflective multilayered coating is applied. Reflective coatings that have been found to have acceptable EUV reflectivity include multilayered coatings of molybdenum/silicon (Mo/Si) and molybdenum/beryllium (Mo/Be). The maximum theoretical reflectivity of a multi-layer mirror made of Mo/Si is approximately 72%.

The Mo/Si multilayer structure includes an alternating layer stack of Mo and Si. The Mo and Si layers are deposited in a dc-magnetron sputtering system or an ion beam sputtering system. The thickness of each layer is determined by simultaneously maximizing the constructive interference of the beams reflected at each interface and minimizing the overall absorption to enable more interfaces to contribute to the reflectance.

While the present invention has been described in terms of preferred embodiments, those skilled in the art will readily appreciate that numerous modifications, substitutions and additions may be made to the disclosed embodiment without departing from the spirit and scope of the present invention. Similarly, the skilled artisan will readily appreciate that the deformable mirror shown in FIG. 1 is in no way limited to use with a particular type of short wavelength radiation system or lithography mechanism. It is intended that all such modifications, substitutions and additions fall within the scope of the present invention, which is best defined by the claims below.

We claim:

1. A deformable mirror, comprising:

a face plate having a reflective coating on one side thereof that is compatible with radiation having a wavelength less than about 200 nanometers;

a reaction plate;

a plurality of actuators, each having first and second ends, wherein the first end is connected to the face plate and wherein the second end is connected to the reaction plate; and control means for individually controlling each of the plurality of actuators to deform the face plate and reaction plate.

2. The apparatus of claim 1, wherein the coating is compatible with radiation having a wavelength less than about 20 nanometers.

3. The apparatus of claim 1, wherein the first end of each actuator is connected to a side of the face plate opposite the coating.

4. The apparatus of claim 1, wherein the reaction plate is more flexible than the face plate, thereby resulting in greater deformation of the reaction plate relative to the face plate for a given actuator movement.

5. The apparatus of claim 1, wherein the face plate does not have a uniform thickness.

6. The apparatus of claim 1, wherein the face plate and the reaction plate are concave.

7. The apparatus of claim 1, wherein the face plate and the reaction plate are convex.

8. The apparatus of claim 1, wherein the face plate is concave and the reaction plate is convex.

9. The apparatus of claim 1, wherein the face plate is convex and the reaction plate is concave.

10. The apparatus of claim 1, wherein at least one of the face plate and reaction plate is a substantially flat surface.

11. The apparatus of claim 1, wherein the face plate has a spherical surface.

12. The apparatus of claim 1, wherein the face plate has an aspherical surface.

13. The apparatus of claim 1, wherein the control system utilizes a specific voltage/displacement constant for each of the plurality of actuators.

* * * * *